(12) United States Patent
Kellogg et al.

(10) Patent No.: US 9,530,625 B2
(45) Date of Patent: Dec. 27, 2016

(54) METHOD FOR ATTACHMENT OF AN ELECTRODE INTO AN INDUCTIVELY-COUPLED PLASMA

(71) Applicant: FEI Company, Hillsboro, OR (US)

(72) Inventors: Sean Kellogg, Portland, OR (US); Anthony Graupera, Hillsboro, OR (US); William N. Parker, Hillsboro, OR (US); Andrew B. Wells, Portland, OR (US); Mark W. Utlaut, Scappoose, OR (US); Walter Skoczylas, Aloha, OR (US); Gregory A. Schwind, Portland, OR (US); Noel Smith, Lake Oswego, OR (US); Shouyin Zhang, Portland, OR (US)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 14/734,905

(22) Filed: Jun. 9, 2015

(65) Prior Publication Data
US 2015/0357166 A1  Dec. 10, 2015

Related U.S. Application Data

(63) Continuation of application No. 13/307,830, filed on Nov. 30, 2011, now Pat. No. 9,053,895.

(51) Int. Cl.
| | |
|---|---|
| *H01J 37/32* | (2006.01) |
| *H01J 9/02* | (2006.01) |
| *H01J 37/04* | (2006.01) |
| *H01J 37/08* | (2006.01) |
| *H01J 27/16* | (2006.01) |

(52) U.S. Cl.
CPC ............ *H01J 37/32605* (2013.01); *H01J 9/02* (2013.01); *H01J 27/16* (2013.01); *H01J 37/04* (2013.01); *H01J 37/08* (2013.01); *H01J 2237/032* (2013.01)

(58) Field of Classification Search
None
See application file for complete search history.

(56) References Cited

U.S. PATENT DOCUMENTS

| | | | |
|---|---|---|---|
| 7,241,361 | B2 | 7/2007 | Keller et al. |
| 7,670,455 | B2 | 3/2010 | Keller et al. |
| 8,168,957 | B2 | 5/2012 | Keller et al. |
| 2003/0106644 | A1 | 6/2003 | Sirkis et al. |
| 2010/0037824 | A1 | 2/2010 | Lee |

(Continued)

FOREIGN PATENT DOCUMENTS

EP  1220272  3/2002

OTHER PUBLICATIONS

Fumikazu Imai et al., "Performance Characteristics of an Oxygen Radical Beam Radio-Frequency Source", Journal of vacuum Science and Technology, Sep./Oct. 1995, vol. 13, No. 5, 5 pages.

(Continued)

*Primary Examiner* — Britt D Hanley
(74) *Attorney, Agent, or Firm* — Scheinberg & Associates, P.C.; Michael O. Scheinberg (57) ABSTRACT

An inductively coupled plasma charged particle source for focused ion beam systems includes a plasma reaction chamber with a removably attached source electrode. A fastening mechanism connects the source electrode with the plasma reaction chamber and allows for a heat-conductive, vacuum seal to form. With a removable source electrode, improved serviceability and reuse of the plasma source tube are now possible.

16 Claims, 7 Drawing Sheets

(56) References Cited

U.S. PATENT DOCUMENTS

2010/0126964 A1    5/2010 Smith et al.
2012/0280136 A1  11/2012 Zhang et al.
2012/0319000 A1  12/2012 Keller et al.
2013/0015765 A1   1/2013 Graupera et al.

OTHER PUBLICATIONS

G.D. Alton et al., "A High-Intensity, RF Plasma-Sputter Negative Ion Source", The Eighth International Conference on Heavy-Ion Accelerator Technology, AIP Conference Proceedings, 1999, 14 pages.

C.D. Coath et al., "A High-Brightness Duoplasmatron Ion Source for Microprobe Secondary-Ion Mass Spectrometry", Review of Scientific Instruments, Feb. 1995, 6 pages.

Lili Ji, "Plasma Ion Sources and Ion Beam Technology in Microfabrications", Graduate Division of the University of California, Fall 2007, 165 pages.

R.F. Welton et al., "Development Status of the SNS Ion Source", Proceedings of the 2003 Particle Accelerator Conference, 2003, 3 pages.

FIG. 1A

FIG. 1B  SECTION A-A

FIG. 2A

FIG. 2B  SECTION B-B

SECTION C-C

SECTION D-D

FIG. 5A

FIG. 5B  SECTION E-E

FIG. 6A

FIG. 6B SECTION F-F

FIG. 7

METHOD FOR ATTACHMENT OF AN ELECTRODE INTO AN INDUCTIVELY-COUPLED PLASMA

This Application is a divisional of U.S. application Ser. No. 13/307,830, filed Nov. 30, 2011, which is hereby incorporated by reference.

TECHNICAL FIELD OF THE INVENTION

The present invention relates to inductively coupled plasma charged particle sources used in focused charged particle beam systems and more particularly, to a plasma ion source having a removable source electrode.

BACKGROUND OF THE INVENTION

Inductively coupled plasma (ICP) sources have advantages over other types of plasma sources when used with a focusing column to form a focused beam of charged particles, i.e., ions or electrons. An inductively coupled plasma source, such as the one described in U.S. Pat. No. 7,241,361, to Keller et al. for "Magnetically Enhanced, Inductively Coupled Plasma Source for a Focused Ion Beam System," which is assigned to the assignee of the present invention, is capable of providing charged particles within a narrow energy range, thereby reducing chromatic aberrations and allowing the charged particles to be focused to a small spot.

The charged particles extracted from an inductively coupled plasma system emerge from a small (~0.2 mm diameter) hole located in one bounding wall of the plasma reaction chamber. This particular wall is typically metal and is called the "source" electrode. However, in order not to shunt the magnetic fields around the reaction chamber, the majority of the chamber walls are made from insulating materials such as ceramic or quartz.

In current ICP ion sources, the source electrode is fixedly attached and cannot be removed after mounting. The attachment method is typically gluing (epoxy) of the source electrode into the lower opening of the source tube. In a first step, a thin metal layer is applied directly to the source tube at the locations where the source electrode will be glued. The source electrode is then glued onto the metallization layer with the assistance of a precisely positioned fixture, the glue forming the vacuum seal and none of the glue facing the plasma reaction chamber.

It has been observed that the plasma degrades the epoxy in some modes of operation, causing significant operational difficulties. One such difficulty is the plasma source being contaminated by the epoxy, leading to a redistribution of carbon from the epoxy to the reaction chamber sidewalls, shunting the inductive coupling of energy around the reaction chamber. Once a source tube has become contaminated from use, it cannot be cleaned and must be discarded, and the expense of replacing the source tube increases the cost of operation for the ICP source. Another such difficulty is due to the heating of the epoxy by the elevated source electrode temperature from plasma bombardment and eddy current heating. If the heating of the epoxy is not well compensated by active cooling, the epoxy can thermally decompose, leading to epoxy bond failure. Another such difficulty is when the vacuum seal between the source tube and the FIB column develops leaks due to openings in the epoxy seal, thereby reducing the achievable gas pressures within the source tube, leading to decreased ion generation.

SUMMARY OF THE INVENTION

An object of the invention is to provide a system for removable attachment of an electrode onto an inductively coupled plasma ion source for use in a focused ion beam system.

Embodiments of the invention provide systems and methods for removably attaching a source electrode to a plasma reaction chamber used in a focused ion beam system. The source electrode, capable of being removably attached to the plasma chamber, is preferably vacuum tight, thermally conductive, precisely positioned, robust in strong electric fields, and is easily detached for reconfiguration and maintenance.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Various embodiments of the present invention include a number of mounting methods for a source electrode in an ICP charged particle source. A source electrode performs several functions within the plasma source, including: providing high voltage to the plasma (which determines the ion or electron energies at the work piece), providing a pumping barrier to preserve sufficient pressure levels within the reaction chamber to enable plasma generation while simultaneously maintaining high vacuum within the FIB or electron column below the source, and serving as the first element of the first lens in the focusing column, which requires high positioning precision to maintain concentricity and parallelism to the extraction electrode in order to prevent lens distortions.

The joint between the source electrode and the rest of the reaction chamber should satisfy the following requirements: the joint must form a vacuum seal so that a maximum pressure difference can be maintained between the reaction chamber and the downstream volume; the joint must conduct heat as efficiently as possible because the source electrode will absorb heat from the plasma and from inductively coupled eddy currents, and the reaction chamber serves as the heat sink; the joint must remain robust even in contact with the plasma discharge; the joint must precisely position the source electrode, both location and orientation, to ensure a high performance ion beam; and the joint must remain stable despite the high voltage fields between the source electrode and nearby parts at other electric potentials to avoid arc discharge.

To provide high voltage to the plasma, it is necessary to provide an electrical connection to the source electrode. To provide the pumping barrier, it is necessary that the mounting scheme maintains a good vacuum seal after installation of the source electrode. To provide a first element of the lens, it is necessary that the mounting system maintains good concentricity and parallelism with respect to the focusing column.

A source electrode system is preferably composed of a material, such as molybdenum or a nickel-based super-alloy such as Hastelloy C2000, that is compatible with the harsh environment of a plasma chamber. The source electrode system must also have a thermal coefficient of expansion that is compatible with that of the ceramic or quartz plasma chamber, since the plasma chamber cycles between a high operating temperature and room temperature. "Compatible" means that neither the individual components nor the assembly will be damaged or weakened over the range of temperatures encountered during manufacture and operation. Many materials that are compatible with the harsh environment have poor thermal coefficient of expansion matches to ceramic, making the design of the electrode attachment system difficult.

Various embodiments of the invention solve this problem and include multiple means for attachment of a source electrode to a plasma reaction chamber that is vacuum tight, thermally conductive, precisely positioned, stable in strong electric fields, and is easily detached for reconfiguration. In some embodiments of this invention, the surfaces of an attaching portion of the insulating reaction chamber, that is, the portion facing the source electrode, are coated with a thin interface layer, typically of metal. In one embodiment, the reaction chamber is made of alumina ceramic and the interface layer is a metallization layer made by a two-part process, the first step being the sintering of a molybdenum-manganese layer to the ceramic, and the second step being the electrochemical or mechanical plating of nickel on top of the first layer. The nickel layer provides a suitable mechanical attachment for a ring that is brazed to the thin metal layer. The thin metal layer also provides that the electric fields outside of the source electrode region are expelled out of the vacuum chamber and into the insulating sidewalls. Molybdenum-manganese is preferred for the base layer because the molybdenum diffuses into the alumina to some extent after a high temperature fire process, thereby ensuring excellent, conformal bonding with the alumina surface. The invention is not limited to any specific materials. Alternative materials can be selected, based on the examples and guidance provided herein, for various components and the interface layer. A metal mounting ring is brazed or otherwise permanently attached to the interface layer, and then the source electrode is preferably removably attached to the metal mounting ring. In some embodiments, the mounting ring incorporates a flexible region such as a bellows to enhance its pliability and better accommodate differences in thermal expansion of the ring and the reaction chamber sidewalls. In any of the embodiments above, the contact interface or joint between the mounting ring or source electrode and the attaching portion of the chamber is preferably heat conductive since the source electrode will absorb heat from the plasma and from inductively coupled eddy currents.

Figure 1A:
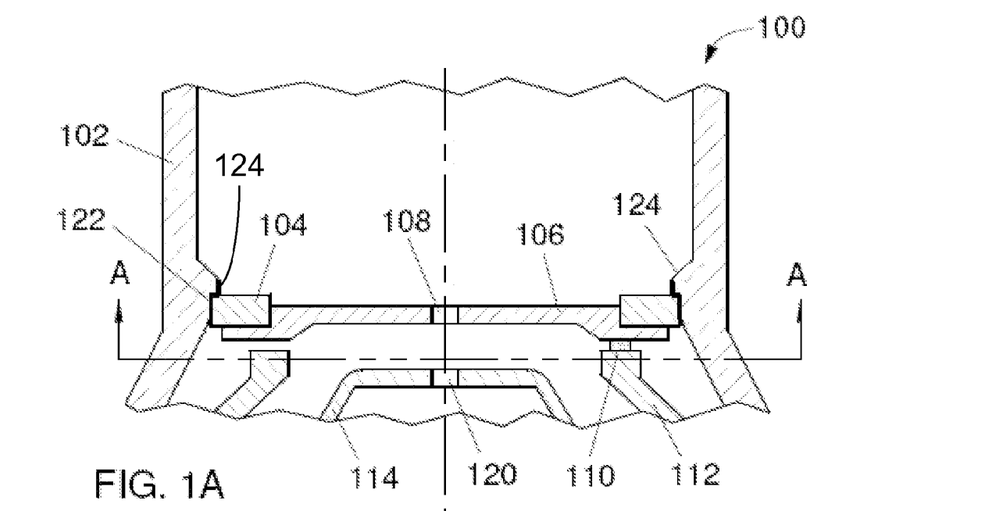
FIG. 1A shows a cross-sectional view of a portion of an inductively coupled plasma charged particle source in which the source electrode is press fit into the source. Some background lines are omitted to clarify features in the plane of the cross section.

FIG. 1A is a side cross-sectional view of an embodiment of the invention including a portion of an inductively coupled plasma charged particle source 100 in which the source electrode is attached by being press fit into the source assembly. An insulating source chamber 102 is shown with a mounting ring 104 fixedly attached, typically by brazing or gluing against a mounting tab 124 portion of the insulating source chamber 102. The attachment surface of the chamber has a thin metallization layer 122 in order to manage the large electric fields surrounding the electrode system. A source electrode 106 is removably attached to the mounting ring 104, by a press-fit into the inner diameter of the mounting ring 104, forming a vacuum seal. The source electrode 106 preferably comprises a metal on the plasma facing surface which is resistant to the corrosive properties of the plasma. For example, nickel-based super alloys such as Hastelloy C2000 resist the strongly corrosive effects of oxygen plasmas and therefore maintain their performance for longer than materials which oxidize readily. The contact interface layer on the attaching portion of the reaction chamber wall where the mounting ring 104 attaches is preferably an interface layer metalized with molybdenum-manganese which is further coated with nickel, for example. In other embodiments, the interface layer includes a soft metal, such as gold, indium, or aluminum. The contact interface is preferably heat conductive since the source electrode will absorb heat from the plasma and from inductively coupled eddy currents.

Figure 1B:
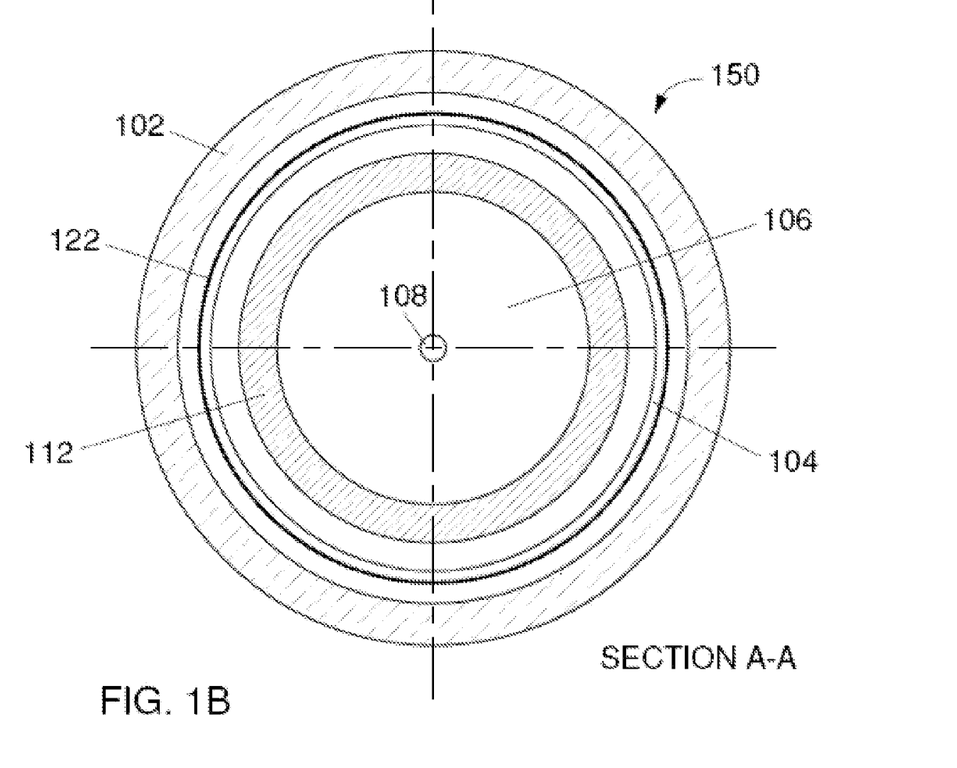
FIG. 1B shows a cross-sectional view from the perspective of section line A-A in FIG. 1A.

In the event the source electrode 106 become damaged, for example due to corrosion or erosion from the plasma within the source tube 102, the ICP source 100 can be repaired by removal of the source electrode 106 from the mounting ring 104. This is beneficial because the source tube 102 is typically an expensive precision component, and it is therefore desirable to be able to reuse the source tube 102 in the event that the source electrode 106 needs replacement. A source contact electrode 112 provides an electrical connection to the source electrode 106 through a plurality of connection pins 110 (one shown) which protrude up from the source contact electrode 112 and press against the lower surface of the source electrode 106 as shown. Below the source electrode, the upper portion of a source extractor 114 is shown. The hole 108 in the source electrode 106 permits an ion beam to be extracted from the interior of the source tube 102 by an electric field between the source electrode 106 and the source extractor 114—this electric field also forms part of the first focusing lens field for the ion beam generated by the ICP ion source 100. For the optimum operation of the first focusing lens, the concentricity of holes 108 and 120 should be held to within at most 4% of the diameter of hole 108. FIG. 1B shows an upward looking view at the bottom of the source electrode from the perspective of section line A-A 150 in FIG. 1A.

Figure 2A:
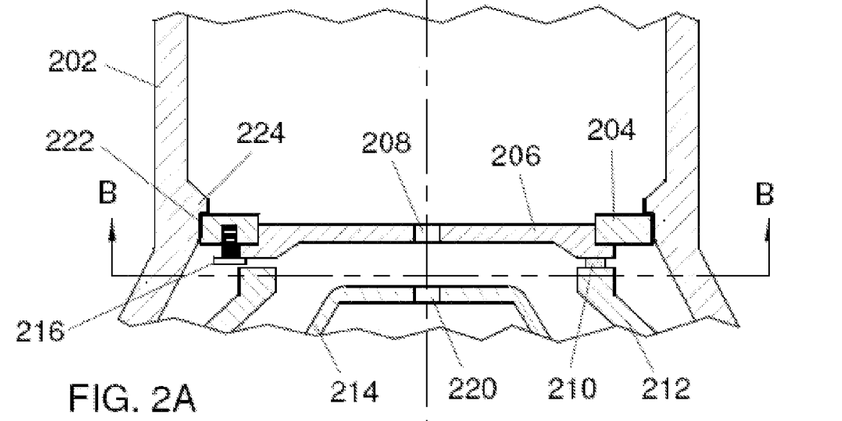
FIG. 2A shows a cross-sectional view of a portion of an inductively coupled plasma charged particle source in which the source electrode is attached to the source by a screw-clamp. Some background lines are omitted to clarify features in the plane of the cross section.
Figure 2B:
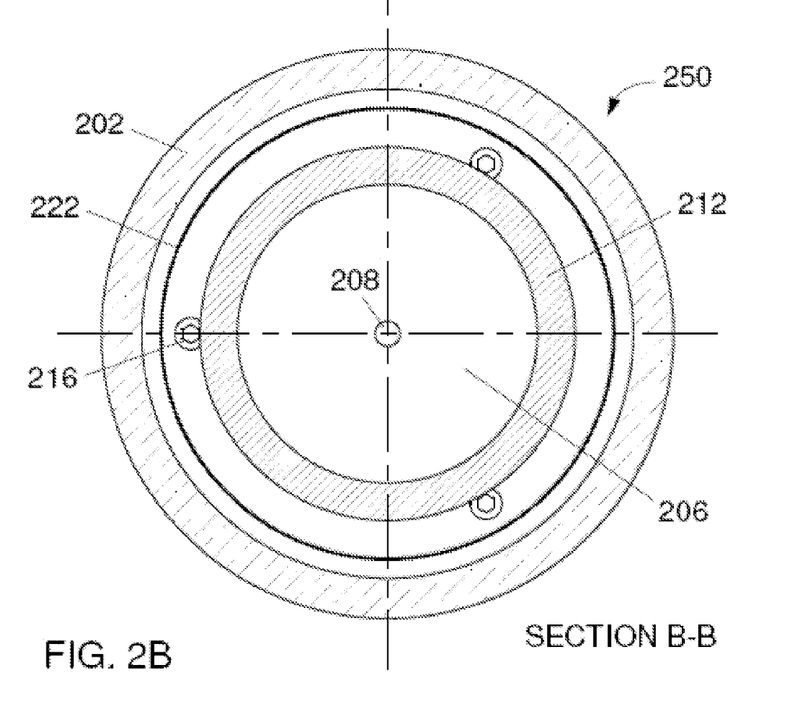
FIG. 2B shows a cross-sectional view from the perspective of section line B-B in FIG. 2A.

FIG. 2A is a side cross-sectional view of a preferred embodiment of the invention including a portion of an inductively coupled plasma charged particle source 200 in which a screw clamp-type fastening mechanism removably secures the source electrode. An insulating source tube 202 is shown with a mounting ring 204 fixedly attached, typically by brazing or gluing against a mounting tab 224 portion of the insulating source chamber 202. The attachment surface of the chamber has a thin metallization layer 222 in order to manage the large electric fields surrounding the electrode system. A source electrode 206 is removably attached to the mounting ring 204, by a plurality of mounting screws 216, bolts, or any similar fasteners, threaded into the mounting ring 204, and clamping the outer edge of the source electrode 206, pushing the source electrode into tight contact with the mounting ring and forming a vacuum seal. The mounting ring 204 preferably comprises a metal that is thermally compatible with the source tube 202. The source electrode 206 preferably comprises a metal on the plasma facing surface which is resistant to the corrosive properties of the plasma. The materials for making the components of plasma source 100 are also suitable for making the components of plasma source 200, as well as the other plasma sources described below. The same considerations of cost and maintainability apply here as for the embodiment 100 in FIG. 1A. A source contact electrode 212 provides an electrical connection to the source electrode 206 through a plurality of connection pins 210 (one shown) which protrude up from the source contact electrode 212 and press against the lower surface of the source electrode 206 as shown. Below the source electrode, the upper portion of the source extractor 214 may be seen. The hole 208 in the source electrode 206 permits an ion beam to be extracted from the interior of the source tube 202 due to an electric field between the source electrode 206 and the source extractor 214—this electric field also forms part of the first focusing lens for the ion beam generated by the ICP ion source 200. For the optimum operation of the first focusing lens, the concentricity of holes 208 and 220 should be held to within at most 4% of the diameter of hole 208. FIG. 2B shows an upward looking view at the bottom of the source electrode from the perspective of section line B-B 250 in FIG. 2A.

Figure 3A:
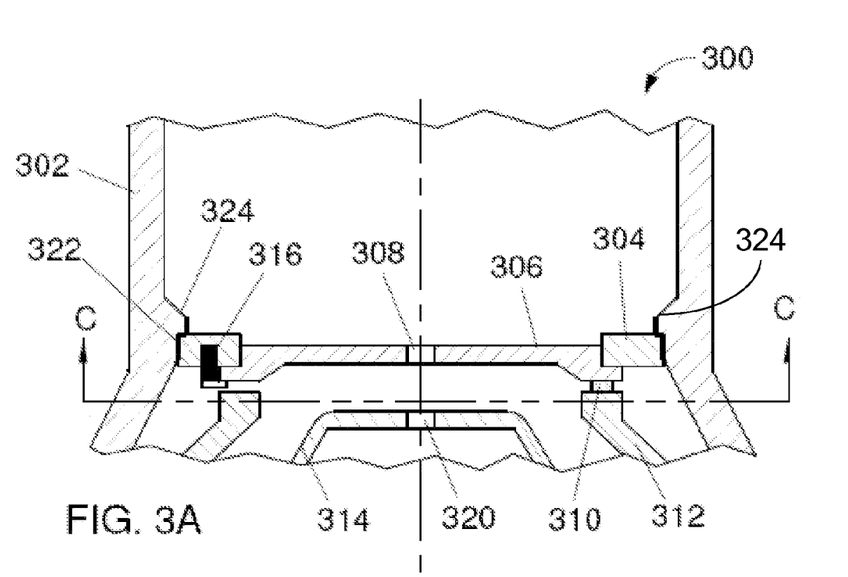
FIG. 3A shows cross-sectional view of a portion of an inductively coupled plasma charged particle source in which the source electrode is attached to the source by a cam-clamp. Some background lines are omitted to clarify features in the plane of the cross section.
Figure 3B:
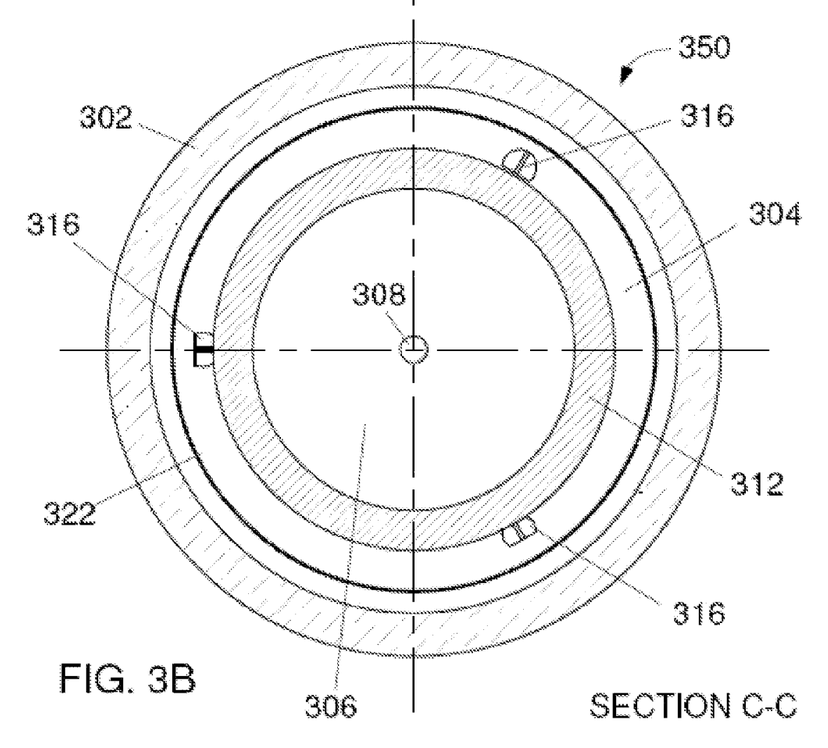
FIG. 3B shows a cross-sectional view from the perspective of section line C-C in FIG. 3A.

FIG. 3A is a side cross-sectional view of a preferred embodiment of the invention including a portion of an inductively coupled plasma charged particle source 300 using a cam-clamp-type fastening mechanism to removably attach the source electrode. A plurality of cam fasteners 316 are positioned around the perimeter of the attaching portion of the plasma chamber. The cams are mounted outside of the chamber and beneath the retaining tab 324 of the attaching portion of the chamber wall. Hex head or socket head screws, bolts or similar fasteners attach the cams to the attaching portion wall. As the cams are tightened, the source electrode is pushed into tight contact with the chamber, forming a vacuum seal. In some embodiments, the precise positioning and alignment of the source electrode is accomplished by adjusting the cams of the fastening mechanism. An insulating source tube 302 is shown with a mounting ring 304 fixedly attached, typically by brazing or gluing. The attachment surface of the chamber has a thin metallization layer 322 in order to manage the large electric fields surrounding the electrode system. A source electrode 306 is removably attached to the mounting ring 304, by a plurality of mounting cams 316, threaded into the mounting ring 304, and clamping the outer edge of the source electrode 306, as shown. Cam 318 is shown rotated so that it is not clamping the source electrode 306—if cams 316 were to be rotated into this same position, removal of the source electrode 306 from the mounting ring 304 would be enabled. The same considerations of materials, cost, and maintainability apply here as for the first embodiment 100 in FIG. 1A. A source contact electrode 312 provides an electrical connection to the source electrode 306 through a plurality of connection pins 310 (one shown) which protrude up from the source contact electrode 312 and press against the lower surface of the source electrode 306 as shown. Below the source electrode 306, the upper portion of the source extractor 314 may be seen. The hole 308 in the source electrode 306 permits an ion beam to be extracted from the interior of the source tube 302 to an electric field between the source electrode 306 and the source extractor 314—this electric field also forms part of the first focusing lens for the ion beam generated by the ICP ion source 300. For the optimum operation of the first focusing lens, the concentricity of holes 308 and 320 should be held to within at most 4% of the diameter of hole 308. FIG. 3B shows an upward looking view at the bottom of the source electrode from the perspective of section line C-C 350 in FIG. 3A.

Figure 4A:
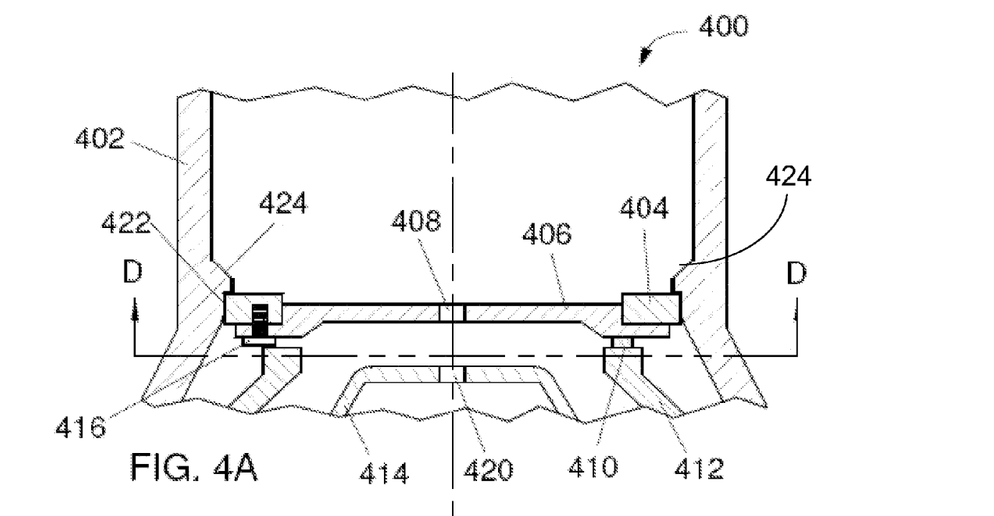
FIG. 4A shows a cross-sectional view of a portion of an inductively coupled plasma charged particle source in which the source electrode is held in by a screw. Some background lines are omitted to clarify features in the plane of the cross section.
Figure 4B:
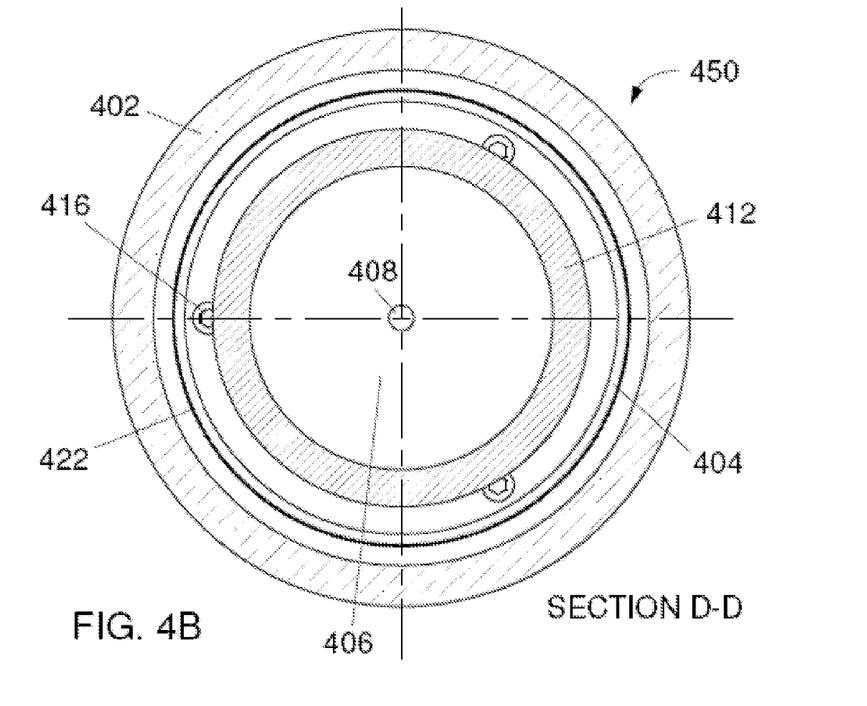
FIG. 4B shows a cross-sectional view from the perspective of section line D-D in FIG. 4A.

FIG. 4A is a side cross-sectional view of a preferred embodiment of the invention including a portion of an inductively coupled plasma charged particle source 400 in which the source electrode is removably attached to the source 400 using a screw-in fastening mechanism. An insulating source tube 402 is shown with a mounting ring 404 fixedly attached, typically by brazing or gluing, at a mounting tab 424 of tube 402. The attachment surface of the chamber has a thin metallization layer 422 in order to manage the large electric fields surrounding the electrode system. A source electrode 406 is removably attached to the mounting ring 404, by a plurality of mounting screws 416. The screws 416 are routed through the source electrode (unlike screws 216) and threaded into the mounting ring 404 such that tightening of the screws pulls the source electrode into tight contact with the mounting ring 404, forming a vacuum seal. The mounting ring 404 preferably comprises a metal which is thermally compatible with the source tube 402. The source electrode 406 preferably comprises a metal on the plasma facing surface which is resistant to the corrosive properties of the plasma. In some embodiments, the contact interface on the attaching portion of the reaction chamber wall where the mounting ring 404 attaches is metalized with a soft metal such as gold, indium, or aluminum. The contact interface is preferably heat conductive since the source electrode will absorb heat from the plasma and from inductively coupled eddy currents. The same considerations of materials, cost, and maintainability apply here as for the first embodiment 100 in FIG. 1A. A source contact electrode 412 provides an electrical connection to the source electrode 406 through a plurality of connection pins 410 (one shown) which protrude up from the source contact electrode 412 and press against the lower surface of the source electrode 406 as shown. Below the source electrode, the upper portion of the source extractor 414 may be seen. The hole 408 in the source electrode 406 permits an ion beam to be extracted from the interior of the source tube 402 due to an electric field between the source electrode 406 and the source extractor 414—this electric field also forms part of the first focusing lens for the ion beam generated by the ICP ion source 400. For the optimum operation of the first focusing lens, the concentricity of holes 408 and 420 should be held to within at most 4% of the diameter of hole 408. FIG. 4B shows an upward looking view at the bottom of the source electrode from the perspective of section line D-D 450 in FIG. 4A.

Figure 5A:
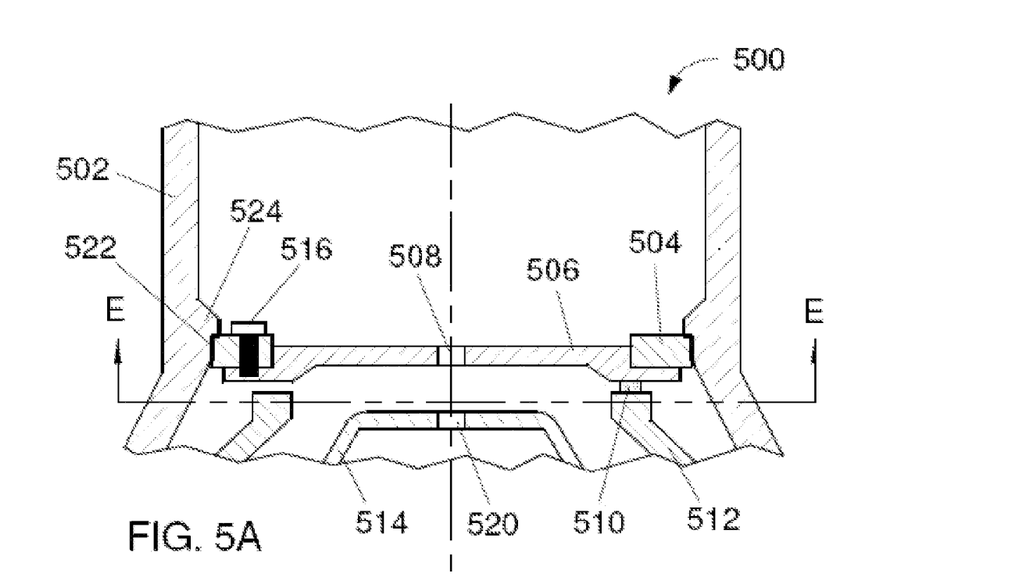
FIG. 5A shows cross-sectional view of a portion of an inductively coupled plasma charged particle source in which the source electrode is attached to the source by screws from inside the plasma chamber. Some background lines are omitted to clarify features in the plane of the cross section.
Figure 5B:
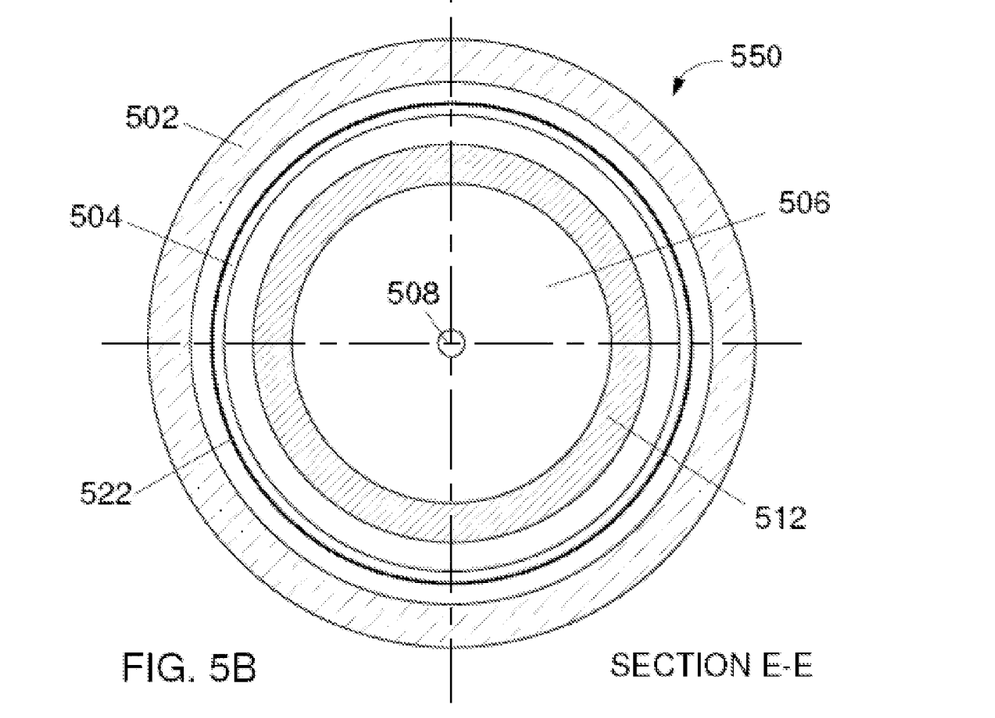
FIG. 5B shows a cross-sectional view from the perspective of section line E-E in FIG. 5A.

FIG. 5A is a side cross-sectional view of an embodiment of the invention including a portion of an inductively coupled plasma charged particle source 500 with in which the source electrode is attached to the source by an in-chamber screw-in fastening mechanism. An insulating source tube 502 is shown with a mounting ring 504 fixedly attached, typically by brazing or gluing against a mounting tab 524 portion of the insulating source chamber 502. The attachment surface of the chamber has a thin metallization layer 522 in order to manage the large electric fields surrounding the electrode system. A source electrode 506 is removably attached to the mounting ring 504, by a plurality of mounting screws 516, passing through clearance holes in the mounting ring 504, and then into tapped holes in the outer edge of the source electrode 506, as shown. The same considerations of cost and maintainability apply here as for the first embodiment 100 in FIG. 1A. A source contact electrode 512 provides an electrical connection to the source electrode 506 through a plurality of connection pins 510 (one shown) which protrude up from the source contact electrode 512 and press against the lower surface of the source electrode 506 as shown. Below the source electrode, the upper portion of the source extractor 514 may be seen. The hole 508 in the source electrode 506 permits an ion beam to be extracted from the interior of the source tube 502 due to an electric field between the source electrode 506 and the source extractor 514—this electric field also forms part of the first focusing lens for the ion beam generated by the ICP ion source 500. For the optimum operation of the first focusing lens, the concentricity of holes 508 and 520 should be held to within at most 4% of the diameter of hole 508. FIG. 5B shows an upward looking view at the bottom of the source electrode from the perspective of section line E-E 550 in FIG. 5A.

Figure 6A:
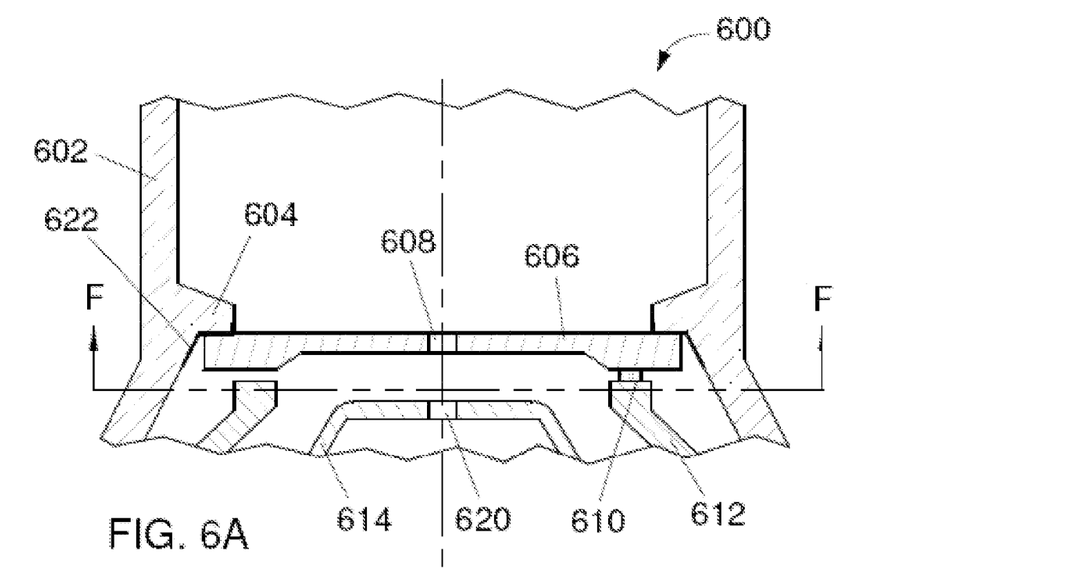
FIG. 6A shows a cross-sectional view of a portion of an inductively coupled plasma charged particle source in which the source electrode is attached to the source by biasing pins. Some background lines are omitted to clarify features in the plane of the cross section.
Figure 6B:
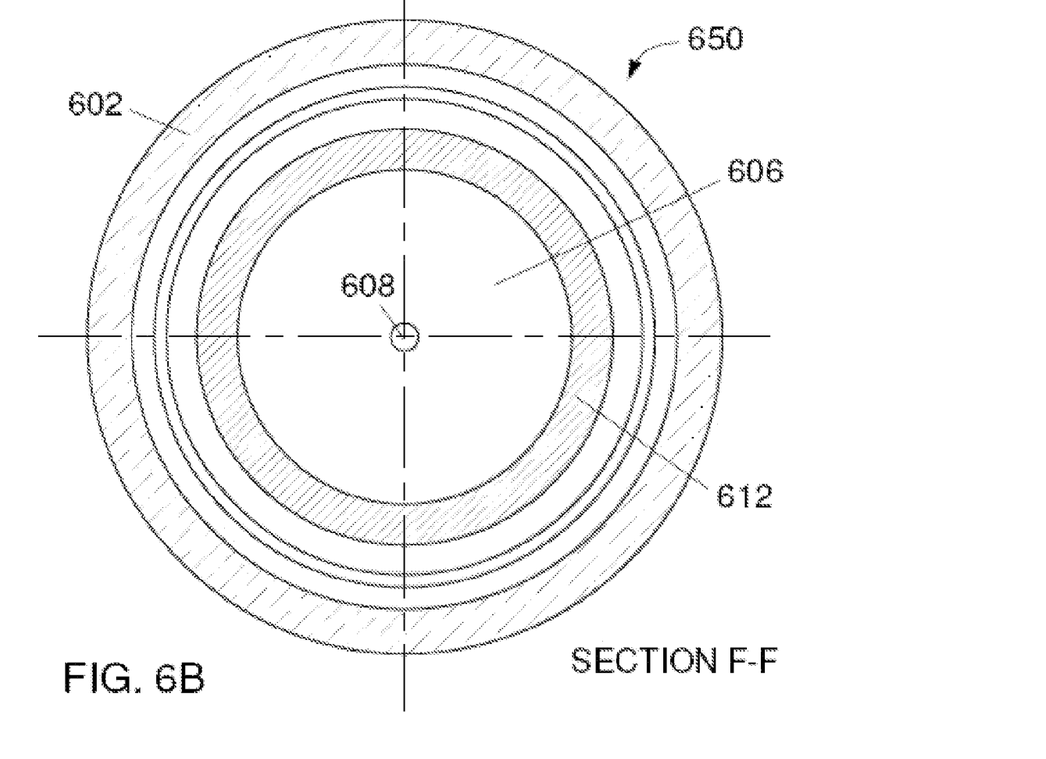
FIG. 6B shows a cross-sectional view from the perspective of section line F-F in FIG. 6A.

FIG. 6A is a side cross-sectional view of an embodiment of the invention including a portion of an inductively coupled plasma charged particle source 600 in which the source electrode is secured to the plasma source using a pin fastening mechanism. An insulating source tube 602 is shown with a mounting step 604 protruding radially inwards, the step having a thin metallization layer 622 in order to manage the large electric fields surrounding the electrode system. A source electrode 606 is removably pressed vertically upwards against the mounting step 604, by a plurality of connection/mounting pins 610. One pin 610 is visible, with two pins behind the plane of the cross section omitted for clarity. A source contact electrode 612 provides an electrical connection to the source electrode 606 through the connection/mounting pins 610 which protrude up from the source contact electrode 612 and press against the lower surface of the source electrode 606 as shown. The pins 610 may be, for example, spring loaded or otherwise biased against the source electrode, or the position of the source contact electrode 612 can be adjusted to press the pins 610 against the source electrode 606 to hold it in place. In this embodiment, a mounting ring is not required as the source electrode is pressed directly against the metallization layer on mounting step 602, although a mounting ring can be used. Below the source electrode, the upper portion of the source extractor 614 may be seen. The hole 608 in the source electrode 606 permits an ion beam to be extracted from the interior of the source tube 602 due to an electric field between the source electrode 606 and the source extractor 614—this electric field also forms part of the first focusing lens for the ion beam generated by the ICP ion source 600. For the optimum operation of the first focusing lens, the concentricity of holes 608 and 620 should be held to within at most 4% of the diameter of hole 608. The same considerations of cost and maintainability apply here as for the first embodiment 100 in FIG. 1A. FIG. 6B shows an upward looking view at the bottom of the source electrode from the perspective of section line F-F 650 in FIG. 6A.

In another embodiment, the source electrode is attached to the plasma chamber at the source attaching portion of the chamber using a bayonet coupling. A plurality of exterior tabs is positioned around the circumference of the cylindrical source electrode which allow for insertion into mating grooves in the walls of the attaching portion of the chamber. With the tabs of the source electrode inserted into the mating grooves, rotating the source electrode causes the tabs to follow the grooves such that the source electrode is pushed into tight contact with the chamber, forming a vacuum seal. Alternately, a mounting ring fixedly attached to the attaching portion of the reaction chamber has mating grooves for bayonet style attachment of the source electrode. The contact interface or joint between the source electrode and attaching portion of the chamber are preferably metalized as described above with respect to other embodiments. The contact interface is preferably heat conductive since the source electrode will absorb heat from the plasma and from inductively coupled eddy currents.

In the above embodiments, the source electrode can be removed and replaced as necessary. In order to remove the source electrode, the fastening mechanisms are loosened and removed or the source electrode is forcibly pressed out in the case that it was simply pressed in with no fastener. With the source electrode thus removed, the plasma source tube can be cleaned and reused accordingly.

Figure 7:
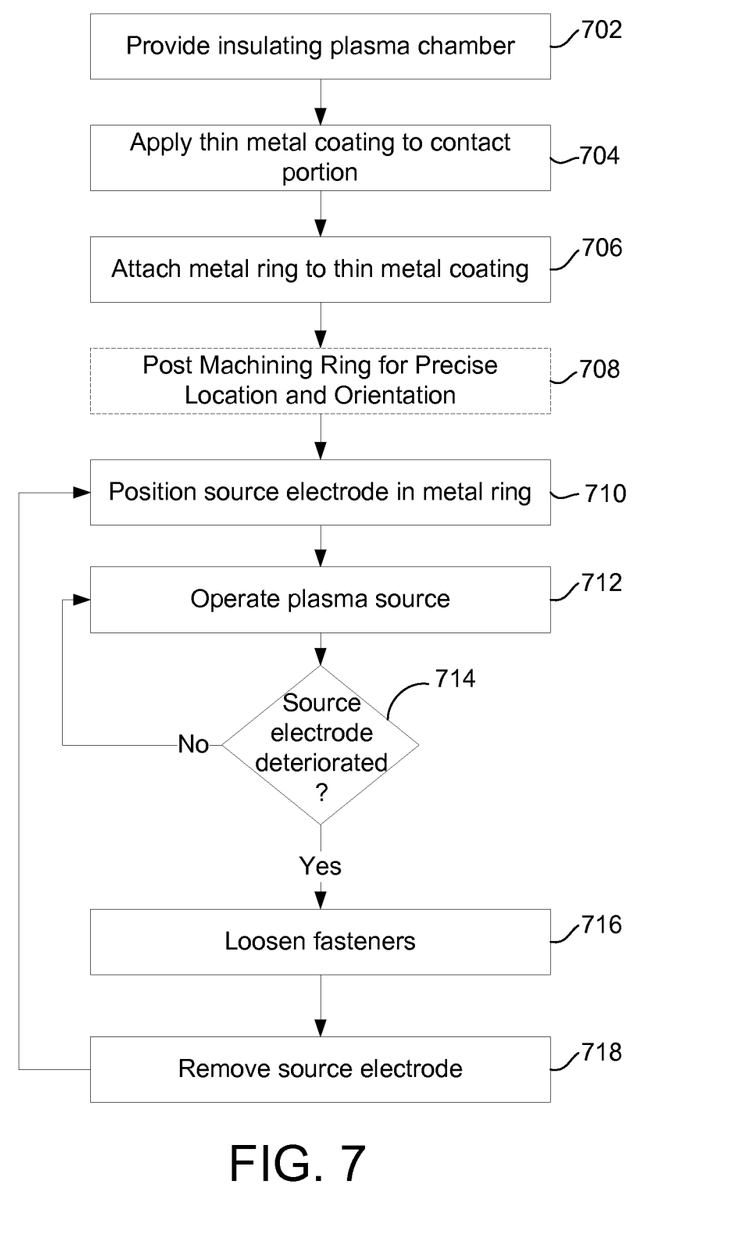
FIG. 7 is a flowchart showing a method of the making and using a removable source electrode.

FIG. 7 is a flow chart showing a method of making and using a plasma system having a replaceable source electrode. In step 702, an insulating plasma chamber, preferably ceramic or quartz, is provided. In step 704, a thin metal layer, such as nickel, molybdenum-manganese, indium, or aluminum, is coated onto a contact portion of the plasma chamber. The coating could be applied, for example, by sintering to form a metallization layer, painting, or electroplating. A multi-step process, such as the two-step metallization process described above can be used to deposit a multilayer coating of different metals. In optional step 706, a metal mounting ring, preferably of molybdenum or a nickel-based super-alloy, is permanently attached to the thin metal, for example, by brazing or gluing. In some embodiments, such as that shown in FIGS. 6A and 6B, a metal ring is not required. In step 708, the chamber-mounting ring assembly is optionally further machined to provide a mounting surface for the source electrode with suitable mechanical tolerance to prevent lens distortions in the focusing column; such tolerance ensuring, for example, a maximum tilt on the source electrode of 0.05 degrees. In some embodiments, the ring is attached using a fixture that precisely aligns the ring and so machining after installation is unnecessary. Precisely positioning and orienting the mounting ring will precisely position and orient the source electrode when it is installed in the ring. In step 710, the source electrode is secured in the mounting ring. In some embodiments, the source electrode is press fit into the ring. In some embodiments, the source electrode is fastened using fasteners that can be readily unfastened to remove the source electrode. In step 712, the plasma source is operated. It will be recognized that steps 704 through 710 are performed before the plasma chamber is mounted in the plasma charged particle source.

When it is determined in decision block 714 that the source electrode requires changing or when the plasma tube needs to be opened and cleaned, the fasteners or other attaching means are loosened in step 716 and the source electrode removed in step 718. The process begins again with step 708, positioning and fastening a new source electrode in the metal ring and operating the plasma source. The source electrode is preferably replaceable without removing the plasma chamber from the plasma source assembly.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method for removable attachment of an electrode to a plasma source, comprising:
   providing a plasma source having a reaction chamber, said reaction chamber having a multilayer metal interface layer on a portion of the reaction chamber to which a source electrode or a component to which the source electrode is attached is mounted; and
   removably attaching the source electrode to the plasma source, the interface layer providing a thermally conductive, vacuum sealable joint between the reaction chamber and the source electrode or a component to which the source electrode is attached.

2. The method of claim 1 in which providing a plasma source having a reaction chamber, said reaction chamber having an interface layer includes providing a mounting ring attached to the interface layer and in which removably attaching the source electrode to the plasma source includes removable attaching the source electrode to the mounting ring.

3. The method of claim 2 further comprising removing the source electrode from the mounting ring and attaching a second source electrode to the mounting ring.

4. The method of claim 2 in which removably attaching the source electrode to the mounting ring includes using fasteners to removably attach the source electrode to the mounting ring.

5. The method of claim 2 in which removably attaching the source electrode to the mounting ring includes press fitting the source electrode to the mounting ring.

6. The method of claim 2 in which the mounting ring is attached to the interface layer by brazing.

7. The method of claim 1 wherein the multilayer metal interface layer comprises molybdenum, manganese, nickel, indium, aluminum, silver, or gold.

8. The method of claim 1 in which a first layer of the multilayer metal layer comprises a material that bonds to the reaction chamber and a second layer of the multilayer metal layer comprises a material that bonds to a mounting ring to which the source electrode is attached.

9. A method for removably attaching an electrode to a plasma source comprising:
   providing a plasma source having a reaction chamber;
   providing an interface layer to the reaction chamber;
   affixing a mounting ring to the interface layer; and
   removably attaching a source electrode to the mounting ring, the combination of the interface layer, mounting ring and source electrode forming a heat conductive seal between the reaction chamber and the source electrode.

10. The method of claim 9, in which attaching an interface layer to the reaction chamber comprises attaching a thin layer of metal to the reaction chamber.

11. The method of claim 10, in which attaching a thin layer of metal further comprises attaching a thin layer of one or more of: molybdenum, manganese, nickel, indium, aluminum, silver, or gold.

12. The method of claim 9, in which the mounting ring and the source electrode comprise a metal that is resistant to the plasma environment and has a thermal coefficient of expansion that is similar to that of the reaction chamber over the range of temperatures endured during manufacture and operation of the plasma source.

13. The method of claim 12, in which the source electrode comprises one or more of: molybdenum, nickel, or cobalt.

14. The method of claim 9, in which affixing a mounting ring to the interface layer further comprises affixing the mounting ring to the interface layer by brazing.

15. A method for removably attaching an electrode to a plasma source, comprising:
   providing a plasma source having a reaction chamber, said reaction chamber having a portion for attaching a source electrode;
   removably attaching a source electrode to the chamber; and
   using a metal interface layer on the reaction chamber to provide a heat conductive, vacuum sealed joint between the reaction chamber and the source electrode or between the reaction chamber and a component to which the source electrode is mounted.

16. The method of claim 15, wherein using a metal interface layer further comprises one or more of: molybdenum, manganese, nickel, indium, aluminum, silver, or gold.

* * * * *